United States Patent
Plat et al.

(10) Patent No.: US 6,187,687 B1
(45) Date of Patent: Feb. 13, 2001

(54) MINIMIZATION OF LINE WIDTH VARIATION IN PHOTOLITHOGRAPHY

(75) Inventors: Marina V. Plat, San Jose; Ming-Yin Hao, Sunnyvale, both of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/187,694

(22) Filed: Nov. 5, 1998

(51) Int. Cl.$^7$ .................................................. H01L 21/00
(52) U.S. Cl. ........................ 438/724; 257/435; 257/437; 148/33.4; 438/744
(58) Field of Search ................... 438/692, 719, 438/724, 725, 744, 757; 148/33.3, 33.4, 33.5, 33; 430/311, 312, 313, 314, 317, 323; 257/435, 437

(56) References Cited

U.S. PATENT DOCUMENTS

| | | |
|---|---|---|
| 5,219,788 | 6/1993 | Albernathey et al. ............ 437/187 |
| 5,472,829 | 12/1995 | Ogawa ............................ 430/325 |
| 5,700,737 * | 12/1997 | Yu et al. ....................... 438/724 X |
| 5,710,067 | 1/1998 | Foote et al. ..................... 437/238 |
| 5,753,418 | 5/1998 | Tsai et al. ....................... 430/313 |
| 5,767,018 | 6/1998 | Bell .............................. 438/696 |
| 5,851,927 * | 12/1998 | Cox et al. ....................... 438/744 |
| 5,920,796 * | 7/1999 | Wang et al. .................. 438/724 X |
| 6,037,276 * | 3/2000 | Lin et al. ........................ 438/706 |

OTHER PUBLICATIONS

Forouhi, et al., "Advances in characterizing SiON for 0.18 and 0.25 micron technologies", SPIE vol. 3332, pp. 493–500.

Gehoel–van Ansem, et al., "Can (sub) 0.18$\mu$m FEOL be realized in production with KrF DUV?", SPIE, vol. 3333, pp. 301–312.

Smeys, et al., "The influence of oxidation–induced stress on the generation current and its impact on scaled device performance", IEEE, pp. 28.2.1–28.2.4 (1996).

* cited by examiner

Primary Examiner—William Powell
(74) Attorney, Agent, or Firm—Skjerven Morrill MacPherson LLP; Roberta P. Saxon

(57) ABSTRACT

A practical photolithographic process for use in manufacturing isolation structures in semiconductor substrates at the 0.18 $\mu$m scale uses an inorganic anti-reflective coating (ARC) layer, particularly silicon oxynitride, under a silicon nitride mask layer to minimize substrate reflectivity. The same ARC layer increases latitude in process conditions in photolithographic patterning of both a first mask layer and a second planarization mask level. The silicon oxynitride layer additionally reduces edge/corner stress in isolation structures, improving gate oxide integrity in the device of which the isolation structure forms a part. Furthermore, because silicon oxynitride and silicon nitride respond to the same process conditions, a silicon oxynitride ARC layer can be introduced without increasing process complexity.

14 Claims, 10 Drawing Sheets

MINIMIZATION OF LINE WIDTH VARIATION IN PHOTOLITHOGRAPHY

TECHNICAL FIELD

The present invention relates generally to semiconductor devices and the fabrication of semiconductor devices and more particularly to process control of lithographic steps in semiconductor fabrication.

BACKGROUND

To achieve increased density and performance of VLSI (very large scale integrated circuits) integrated circuits, the characteristic size of features on those circuits is decreased. Fabrication of IC devices with features smaller than 0.18 μm, particularly fabrication of STI (shallow trench isolation) features, introduces new challenges in process development and control.

The process of making STI trenches typically involves a photolithographic step for patterning features in a photoresist layer overlying a silicon nitride ($Si_3N_4$) layer on a silicon substrate. In this process, dark and bright field features, i.e. thin lines and narrow spaces between structures or lines, are formed at the same time. As the characteristic size of lines and spaces becomes smaller, the acceptable tolerance in feature size variation also becomes smaller.

Variation in the width of the lines and spaces produced in the photoresist layer depends on the photolithographic process conditions, depth of focus and exposure, and on the variation in thickness of the photoresist and underlying silicon nitride layer. However, the lines and spaces do not respond in the same way to the process conditions. While these variations did not present a problem for older devices with larger feature sizes, for 0.18 μm scale devices, even with photoresist and $Si_3N_4$ layer thickness variation kept to a practical minimum, the overlap in optimized process conditions to produce dark and bright field feature variations within acceptable tolerances is vanishingly small. Consequently, at the 0.18 μm scale, the photolithographic process may not be readily manufacturable.

The problem with variation in $Si_3N_4$ thickness is that it leads to variation in substrate reflectivity which, in turn, results in line width variation. A typical stack formed in patterning an isolation structure is shown in FIG. 1a where a patterned photoresist mask 22 overlays a $Si_3N_4$ layer 18 in which a mask pattern is to be formed. An $SiO_2$ layer 14 is between the $Si_3N_4$ layer 18 and the silicon substrate 10. One solution to limiting line width variation is to introduce an organic anti-reflective coating (ARC) 20 between the photoresist and $Si_3N_4$ 18 layers to control substrate reflectivity, as shown in FIG. 1b. However, there are contamination and defect problems associated with organic ARC's. Furthermore, organic ARC's significantly increase processing complexity because they require etching and stripping steps separate from those for $Si_3N_4$ layers.

What is needed is a way to minimize line width variation to provide a manufacturable photolithographic process at the 0.18 μm scale without significantly increasing process complexity.

SUMMARY

According to the present invention, a practical photolithographic process for use in manufacturing isolation structures in integrated circuit devices at the 0.18 μm scale is provided. A silicon oxynitride layer introduced below a silicon nitride mask layer minimizes line width variation by minimizing substrate reflectivity. This reduction in line width variation allows greater latitude in specifying process conditions, such as exposure dose and focus, that pattern lines and spaces in the lithographic process within acceptable variations.

A method of using a silicon oxynitride ARC layer in forming isolation structures is also provided. First, a stack of layers is formed over a silicon substrate by conventional processes. The layers in the stack, from the top down, are: a photoresist layer, the silicon nitride mask layer, the silicon oxynitride ARC layer, and a silicon dioxide layer. Next, the photoresist layer is patterned by conventional exposure and development. Introduction of the silicon oxynitride ARC layer advantageously increases the exposure dose tolerance in the photolithographic process.

A plasma etch is performed to remove portions of the silicon nitride, silicon oxynitride, and silicon dioxide layers, and of the silicon substrate, underlying openings in the patterned photoresist layer. Because silicon oxynitride responds to the same etching conditions as silicon nitride, introduction of the silicon oxynitride ARC layer does not introduce any additional processing complexity.

A thin thermal oxide layer is grown in the etched opening. The silicon oxynitride layer provides the additional benefit of relieving edge/corner stress where the thermal oxide meets the silicon nitride layer, thus improving gate oxide integrity and reliability in a manufactured device of which the isolation structure forms a part.

The process of forming an isolation structure further includes depositing a silicon oxide layer over the thermal oxide, over which a patterned photoresist planarization mask is formed. The silicon oxynitride ARC layer also advantageously increases the tolerance on the process conditions for the patterning of the planarization mask.

Next, unprotected portions of the oxide layer are etched, followed by stripping of the photoresist, chemical mechanical polishing of the oxide, which is followed by chemical stripping of the silicon nitride and silicon oxynitride layer in a single process. The nitride and oxynitride layers both respond to the same chemistry.

BRIEF DESCRIPTION OF THE DRAWINGS

The use of the same reference symbols in different drawings indicates similar or identical items.

DETAILED DESCRIPTION

A practical photolithographic process for use in manufacturing isolation structures in semiconductor substrates with 0.18 μm line widths uses a layer of an inorganic material, silicon oxynitride, as an anti-reflective coating to minimize substrate reflectivity.

Figure 1A:
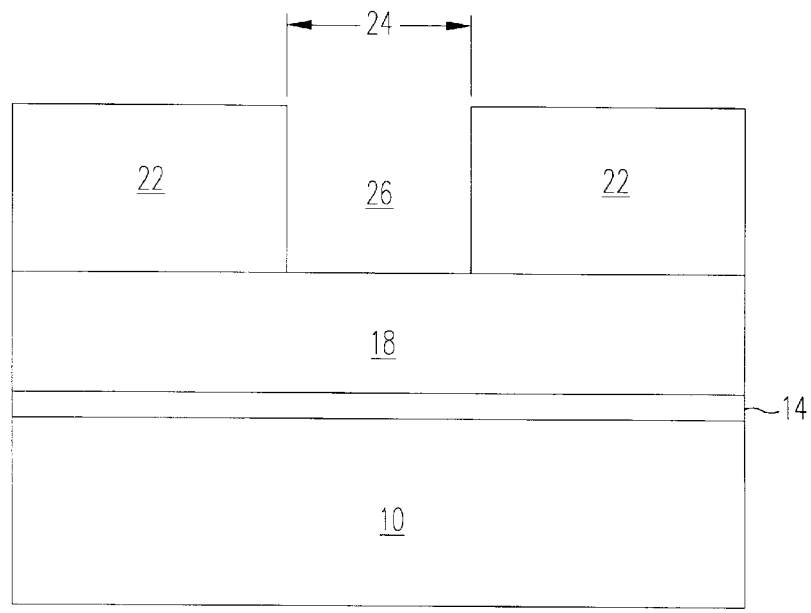
FIGS. 1a and 1b (Prior Art) are simplified cross sections of stacks before etching an isolation structure, without and with an organic anti-reflective coating layer, respectively.

Forming a shallow trench isolation structure in a semiconductor substrate typically involves forming a pattern in a silicon nitride ($Si_3N_4$) mask layer 18, overlying a silicon dioxide ($SiO_2$) layer 14, on a silicon substrate 10, by patterning a first photoresist layer 22, as illustrated in FIG. 1a. The $Si_3N_4$ layer 18 is typically referred to as the source/drain mask layer. As described above, in the photolithographic process, variations in thickness of the $Si_3N_4$ layer 18 are responsible for variations in substrate reflectivity which, in turn, cause variations in the size of critical dimensions such as the width 24 of opening 26 in patterned photoresist layer 22.

Figure 2:
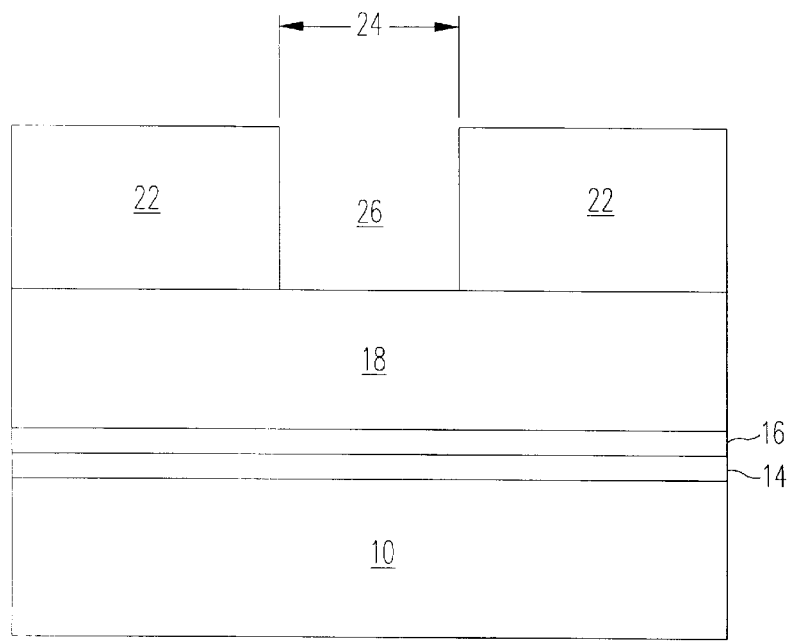
FIG. 2 is a simplified cross section of a stack before etching an isolation trench, in accordance with an embodiment of the present invention.

According to embodiments of the present invention, a silicon oxynitride layer 16 (formally $SiO_xN_y$, and denoted here, for convenience, as SiON) is formed over $SiO_2$ layer 14, prior to forming the $Si_3N_4$ mask layer, as shown in FIG. 2, to serve as an anti-reflective coating (ARC) to control substrate reflectivity.

The dependence of substrate reflectivity and critical dimension on layer composition and thickness in lithographic processes is effectively simulated with the Prolith/2 software modeling tool provided by the Finley Company of Austin, Tex. In this model, each layer is characterized by its thickness, refractive index, n, and extinction coefficient, k. Simulated substrate reflectivity as a function of $Si_3N_4$ layer 18 thickness for the stack shown in FIG. 1a without a SiON ARC layer is given by curve 30 in FIG. 3. Simulated reflectivity for the stack shown in FIG. 2 with a SiON ARC layer 16 under $Si_3N_4$ layer 18 is given by curve 32 in FIG. 3. Input parameters used in the simulation are listed below in Table 1. The model assumes a conventional chemically amplified photoresist. The focal plane for resist exposure was taken at 0.35 μm below the top of resist layer 22.

TABLE 1

| Layer | Thickness (nm) | n | k |
| --- | --- | --- | --- |
| Si 10 | | 1.57 | 3.5 |
| $SiO_2$ 14 | 15 | 1.50 | 0.00 |
| SiON 16 | 28 | 1.93 | 0.6 |
| $Si_3N_4$ 18 | 100–180 | 2.28 | 0.005 |
| Photoresist 22 | 733 | 1.78 | N/A |

Figure 1B:
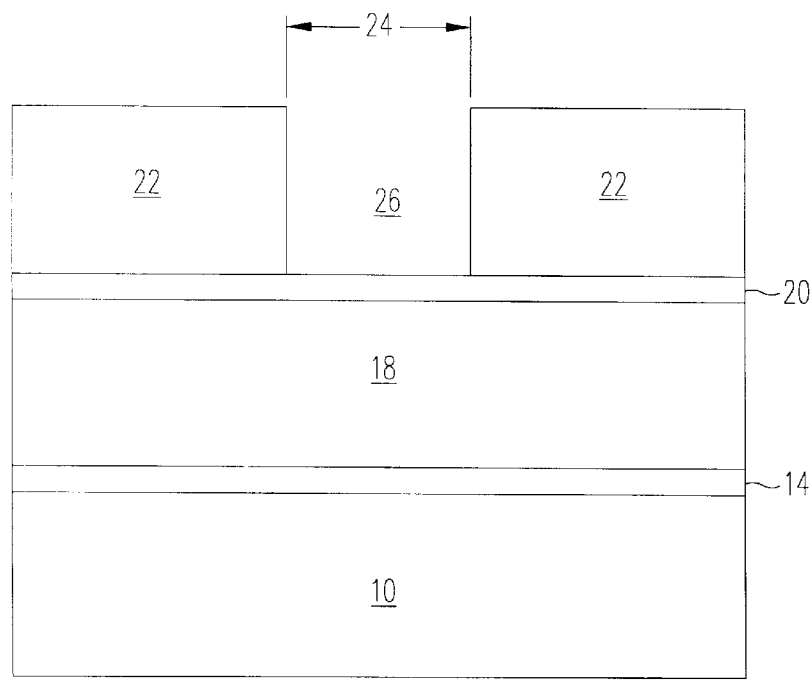
Figure 3:
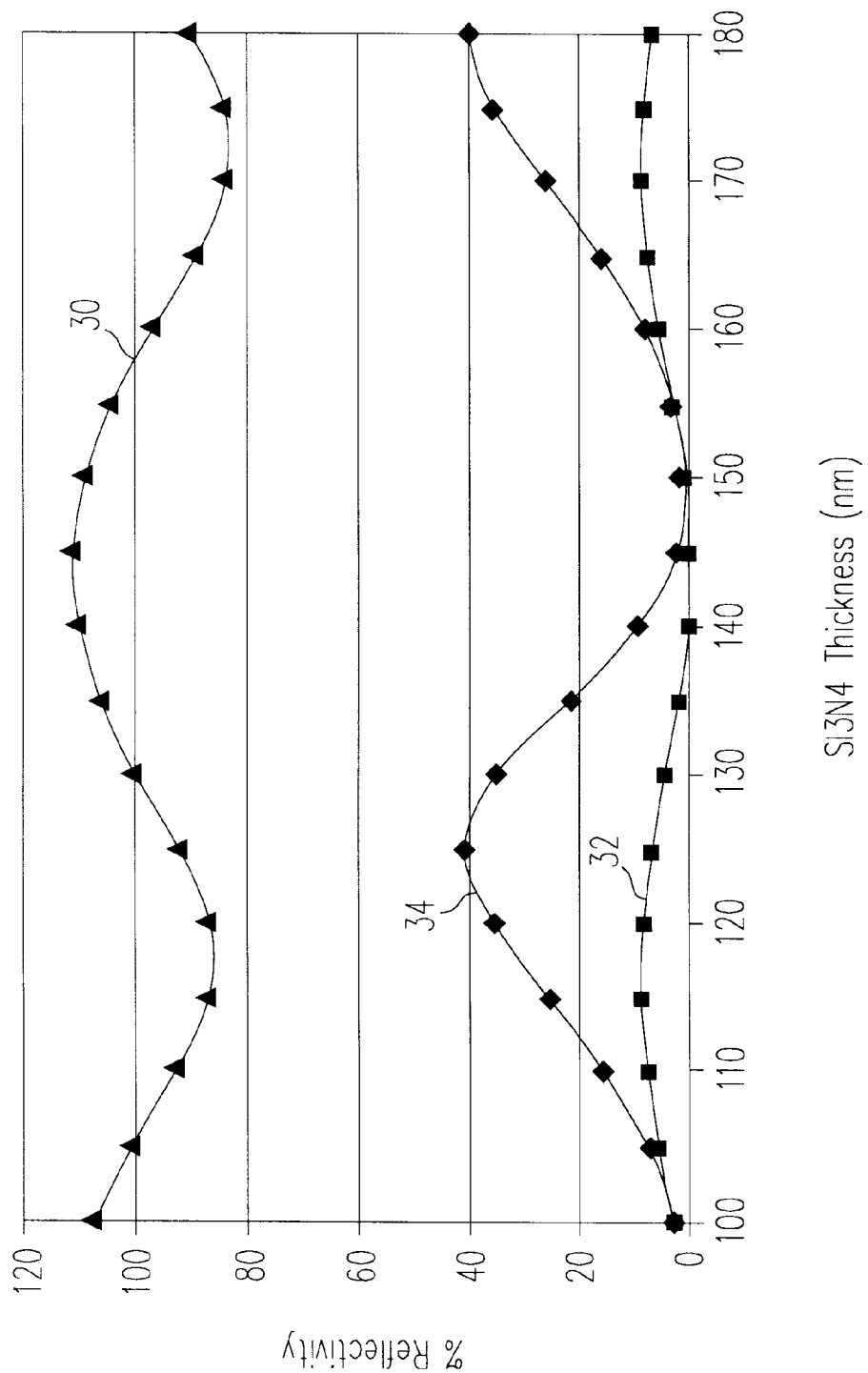
FIG. 3 shows simulated reflectivity (relative to bare silicon) as a function of $Si_3N_4$ layer thickness for the stacks of FIGS. 1a and 2.

The simulations reported in FIG. 3 clearly demonstrate that introducing a SiON ARC layer 16 dramatically reduces both the magnitude of substrate reflectivity, normalized to the reflectivity of bare silicon, and the variation in reflectivity as a function of silicon nitride layer thickness. FIG. 3 also gives reflectivity (curve 34) for a stack with a 35 nm thick SiON ARC layer above $Si_3N_4$ mask layer 18, i.e. for a stack as shown in FIG. 1b with the organic ARC layer 20 replaced by a SiON ARC layer. Placing the SiON ARC layer above the $Si_3N_4$ mask layer reduces the total reflectivity but does not damp the variation in reflectivity with silicon nitride layer thickness.

Figure 4:
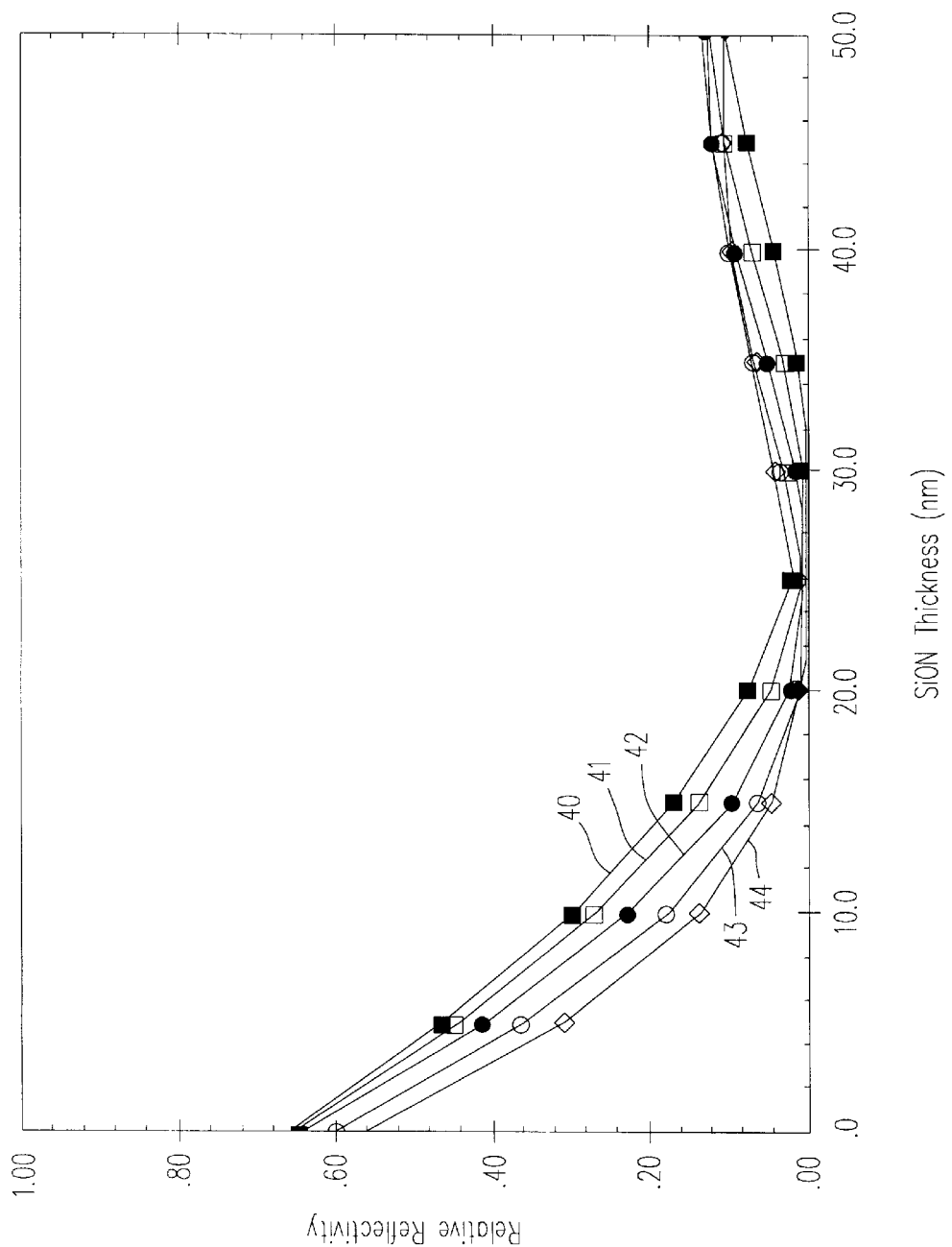
FIG. 4 shows simulated reflectivity as a function of SiON layer thickness for different $Si_3N_4$ layer thicknesses.

Curve 30 in FIG. 3 demonstrates the effect of adding a SiON ARC layer 28 nm thick. The SiON layer thickness can be optimized as shown in FIG. 4 which gives simulated substrate reflectivity as a function of SiON layer 16 thickness for $Si_3N_4$ layer 18 thicknesses of 140 nm (curve 40), 145 nm (curve 41), 150 nm (curve 42), 155 nm (curve 43), and 160 nm (curve 44). The $SiO_2$ 14 and photoresist 22 layers are as given in Table 1. For all $Si_3N_4$ thicknesses shown, reflectivity is predicted to be a minimum for a 26 nm thick SiON ARC layer.

Figure 5:
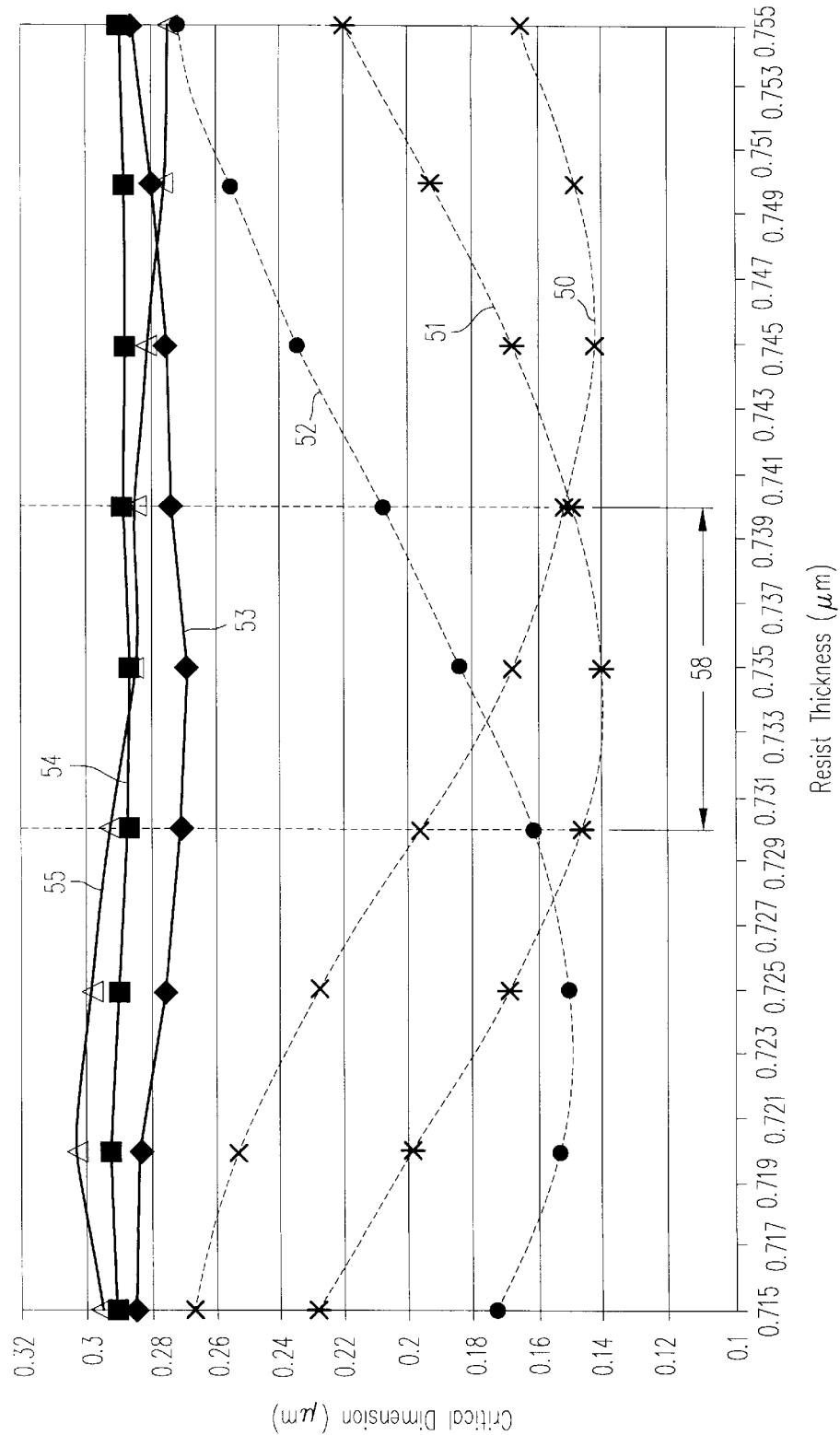
FIG. 5 shows simulated critical dimension values as a function of first photoresist layer thickness for different model stacks.

The benefits of using a 26 nm thick SiON ARC layer below the $Si_3N_4$ layer 18 are demonstrated in FIG. 5, which displays the simulated values of a critical dimension for different $Si_3N_4$ layer 18 thicknesses as a function of photoresist 22 thickness. Results for the stack as in FIG. 1a, without an ARC layer, are shown for $Si_3N_4$ layer 18 thickness of 140 nm (curve 50), 150 nm (curve 51), and 160 nm (curve 52). Corresponding results for the stack as in FIG. 2, with an ARC layer, are given by curves 53, 54, and 55 respectively. In practice, photoresist thickness is typically controlled to ±5 nm, while $Si_3N_4$ thickness is typically controlled to ±15 nm. Looking at the 10 nm, equivalently 0.01 μm, wide range 58 of resist thickness between 0.73 and 0.74 μm in FIG. 5, the critical dimension values for the stack without a SiON ARC layer (curves 50, 52, 52) span a total range of 0.07 μm, while the corresponding variation for the stack with the SiON ARC layer (curves 53, 54, 55) is 0.02 μm.

Figure 6A:
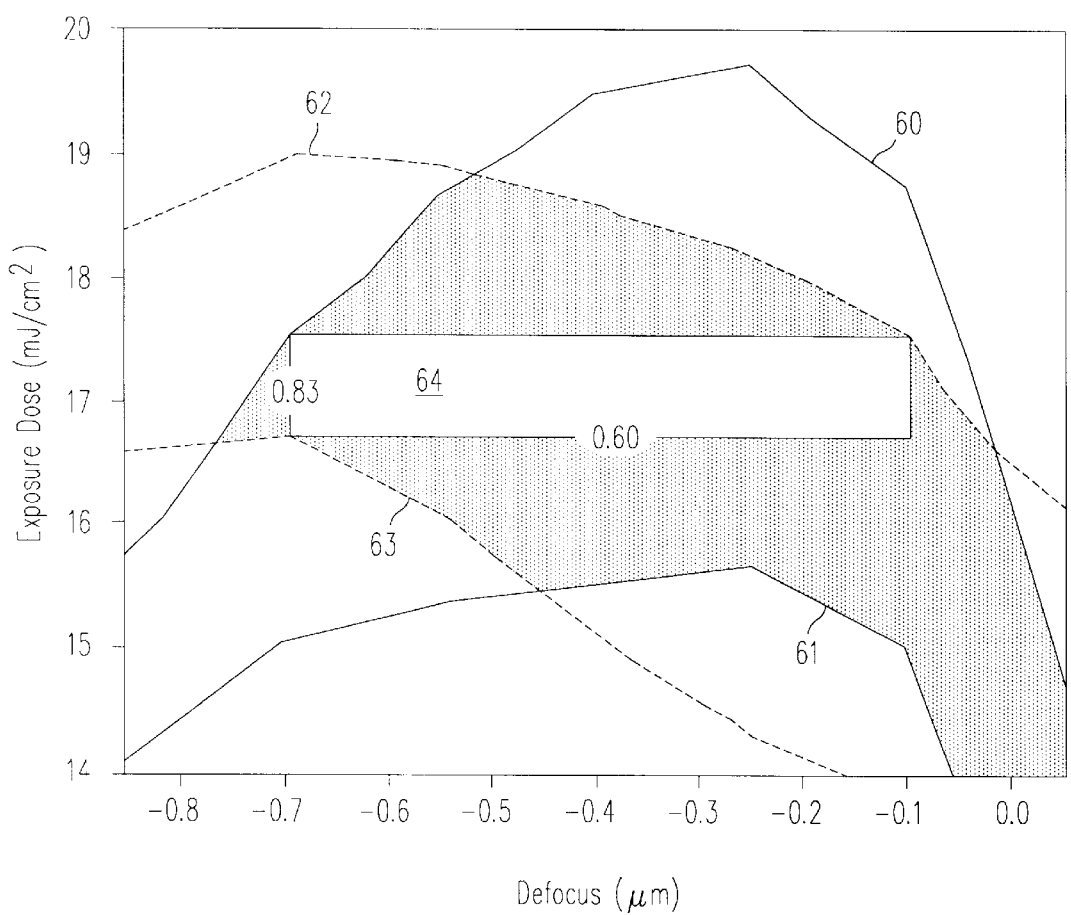
FIGS. 6a and 6b show simulated critical dimension values as a function of process conditions, for a stack without and with a SiON ARC layer, respectively, for printing of the first photoresist layer.
Figure 6B:
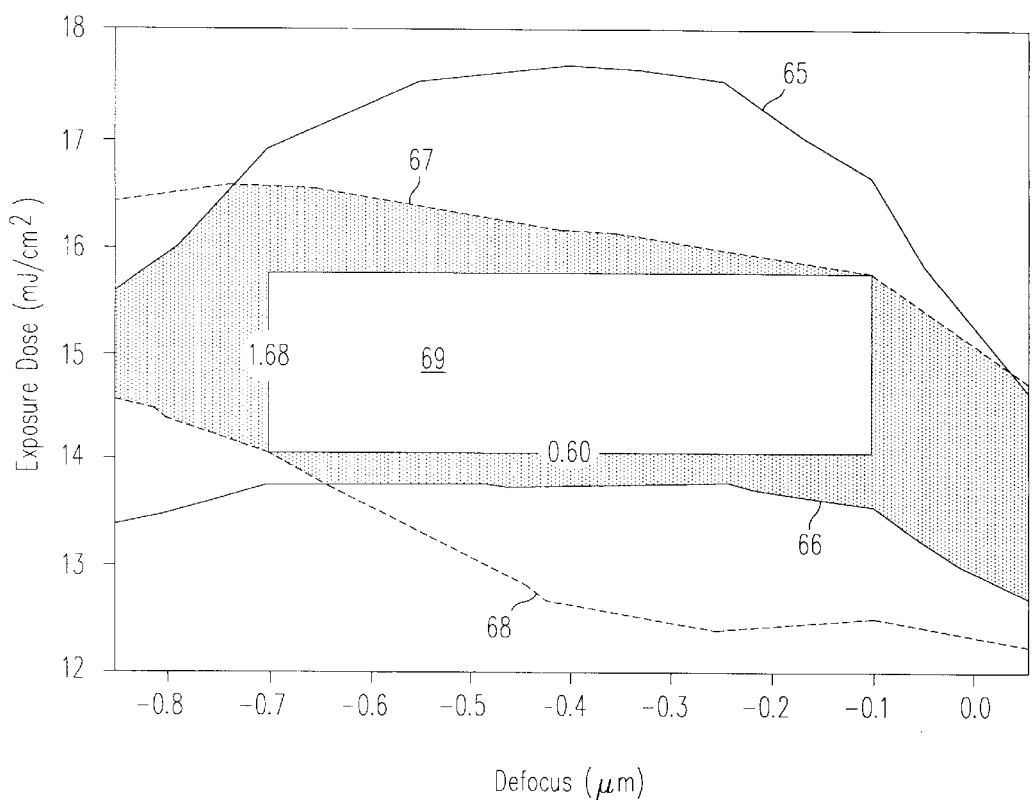

This reduction in variation of a critical dimension allows greater latitude in specifying process conditions as demonstrated in the simulations in FIGS. 6a (for the stack without the SiON ARC layer) and 6b (for the stack with the SiON ARC layer). A 150 nm $Si_3N_4$ layer 18 is used in both simulations. Curves 60 and 61 in FIG. 6a bracket a ±10% variation for a 0.25 μm line as a critical dimension and curves 62 and 63 bracket a ±10% variation in a 0.25 μm space. For focus specified to a typical range of 0.6 μm from an optimal focus, the range in exposure dose to give a 10% variation at the same time for both lines and spaces is 0.83 $mJ/cm^2$, as shown by box 64 in FIG. 6a. Analogous data is given in FIG. 6b for the stack with a SiON ARC layer, where curves 65 and 66 are for a 0.25 μm line and curves 67 and 68 are for a 0.25 μm space. With the SiON ARC layer, the exposure range is doubled to 1.68 $mJ/cm^2$, as illustrated by box 69 in FIG. 6b The process of forming a shallow trench isolation structure in a semiconductor substrate typically additionally includes forming a planarization mask in a second photoresist layer above the $Si_3N_4$ mask layer after oxide deposition in the trench. Introduction of a SiON ARC layer as described above has additional benefits in controlling variation in critical dimensions in forming the planarization mask.

Figure 7:
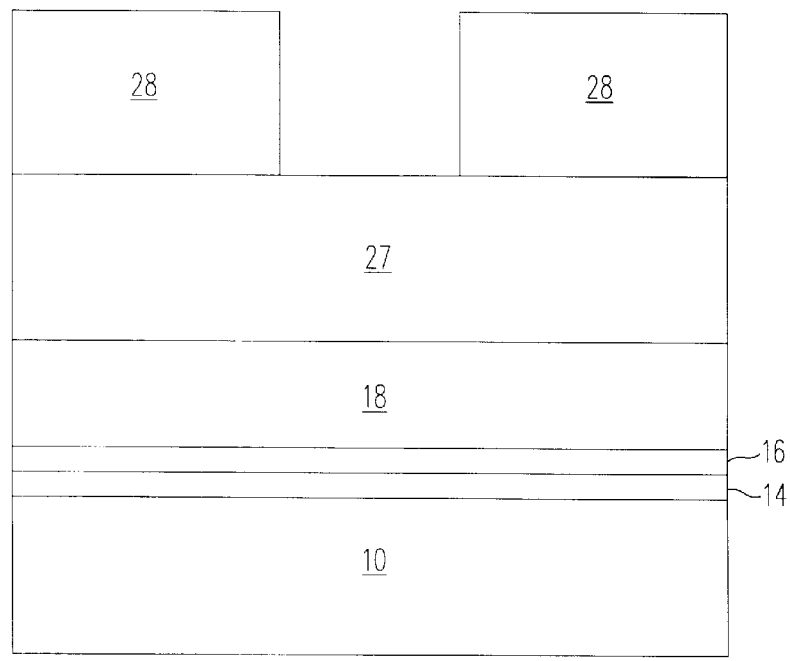
FIG. 7 is a simplified cross section of a stack including a second photoresist layer as a planarization mask layer.
Figure 8:
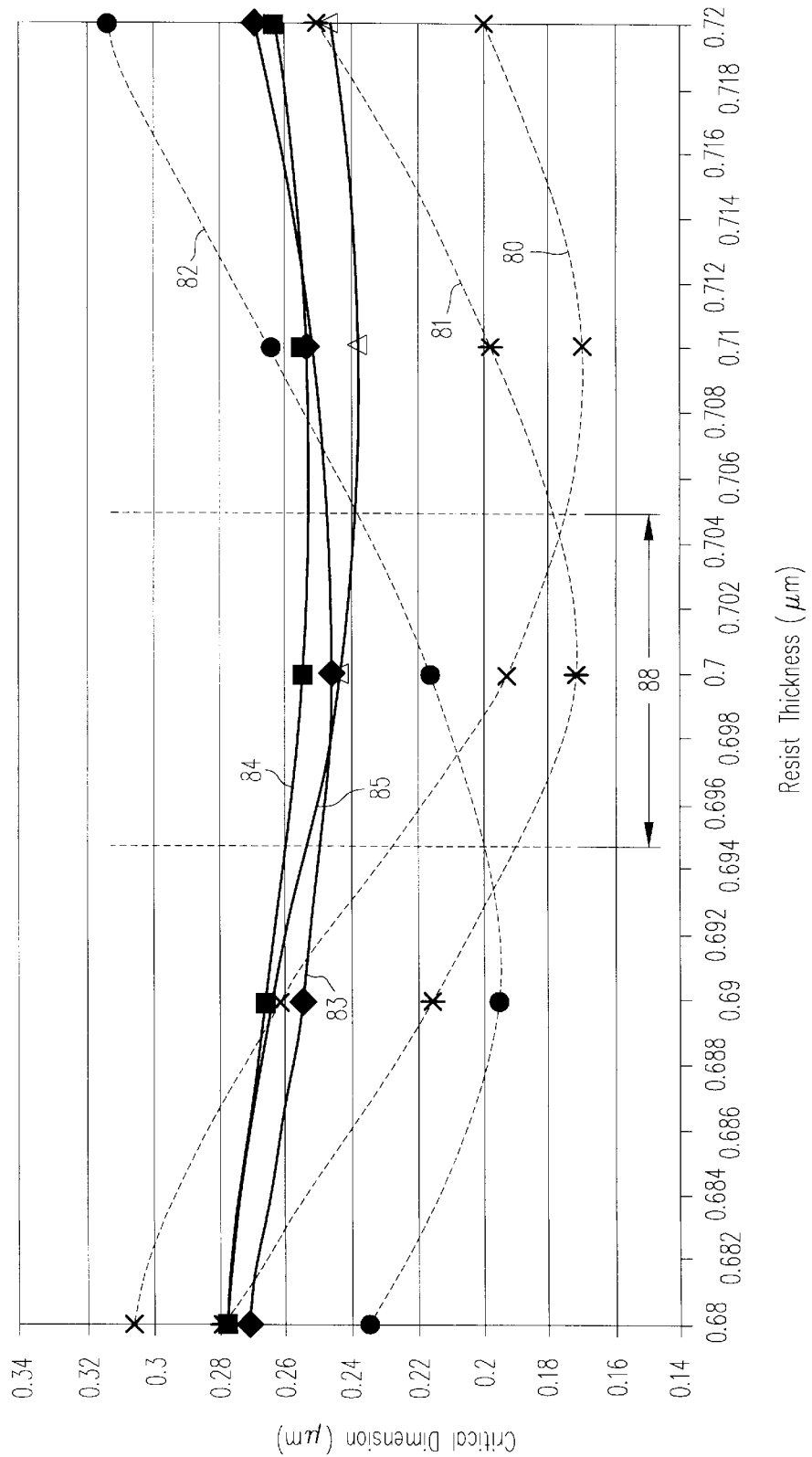
FIG. 8 shows simulated critical dimension values as a function of planarization photoresist layer thickness for different model stacks.
Figure 9:
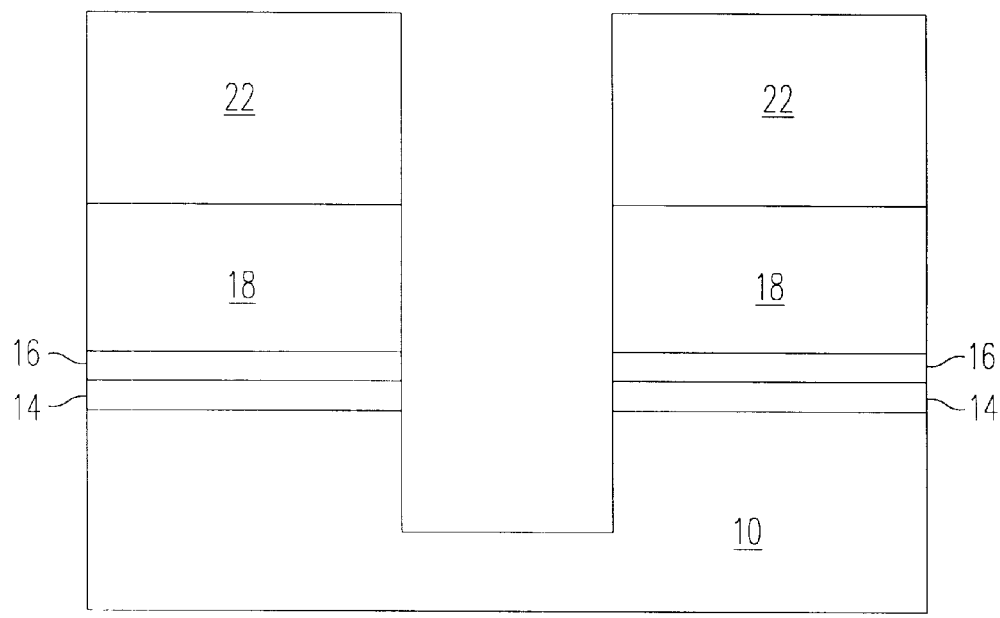
FIGS. 9, 10, 11 and 12 are simplified cross sections illustrating the method of forming an isolation structure, in accordance with embodiments of the present invention.

The planarization mask process is modeled using the stack in FIG. 7, which includes a 620 nm thick $SiO_2$ layer 27 above the $Si_3N_4$ layer 18, topped by a patterned resist layer 28. Predicted variations in critical dimension for a stack with and without a SiON ARC layer 16, are presented in FIG. 8. Over the range 0.01 μm wide range 88 of resist thickness, critical dimensions for the stacks without a SiON ARC layer, (curves 80,81, and 82 for $Si_3N_4$ layer 18 thickness of 140, 150, and 160 nm respectively), span a range of 0.05 μm while the corresponding variation for the stack with the SiON ARC layer (curves 83–85) is <0.02 μm. This reduction in variation of critical dimension allows greater latitude in exposure dose range in the second photolithography process, that is, in forming the planarization mask, analogously as for the formation of the $Si_3N_4$ mask layer.

A method of using a SiON ARC layer in forming isolation structures and the benefits of the ARC layer are illustrated in FIGS. 2 and 9–12. First, a stack as in FIG. 2 is formed by conventional processes. In the illustrated embodiment, a thin thermal oxide layer 14 with a thickness approximately 10 to 20 nm, and preferably approximately 15 nm is grown on silicon substrate 10. A SiON ARC layer 16 is then deposited by, for example, chemical vapor deposition. The thickness of ARC layer 16 is in the range of 20 to 40 nm, and preferably SiON ARC layer 16 has a thickness of approximately 25 to 28 nm. Next, a $Si_3N_4$ layer 18 with thickness in the range of 100 to 200 nm, and preferably approximately 150±15 nm, is deposited by low pressure chemical vapor deposition in a furnace.

A photoresist layer is applied over the nitride layer 18, using a conventional spin-on tool, and exposed to form patterned photoresist layer 22 shown in FIG. 2. A conventional photoresist, for example, UV5, supplied by the Shipley Company, is used. The thickness of photoresist layer 22 is in the range from 500 to 900 nm, and preferably between approximately 700 and 800 nm. Total exposure dose is in the range of 10 to 20 mJ/cm$^2$. For any specific process, exposure dose is optimized for the particular photoresist composition and layer thicknesses. For any specific process, photoresist thickness is typically controlled to ±5 nm. As discussed previously, the exposure dose must be kept within a tight tolerance to produce patterned layer 22 with critical dimensions, such as width 24 in opening 26 within acceptable tolerances for 0.18 $\mu$m scale devices. A major benefit of using the SiON ARC layer 16, according to the present invention, is realized at this step. Introduction of the SiON ARC layer 16 advantageously increases the exposure dose tolerance and minimizes critical dimension variation, providing a practical manufacturable process.

Next, a plasma etch is performed to remove portions of the $Si_3N_4$ layer 18, SiON layer 16, and $SiO_2$ layer 14 underlying opening 26. The etch continues into the silicon substrate 10, to a depth of from approximately 300 to 400 nm to form the trench. The etch process is followed by stripping of the resist layer to produce the structure shown in FIG. 9. The SiON layer 16 responds to the same plasma etch conditions as the $Si_3N_4$ layer 18. Thus addition of the SiON ARC layer does not introduce any additional process complexity.

Figure 10:
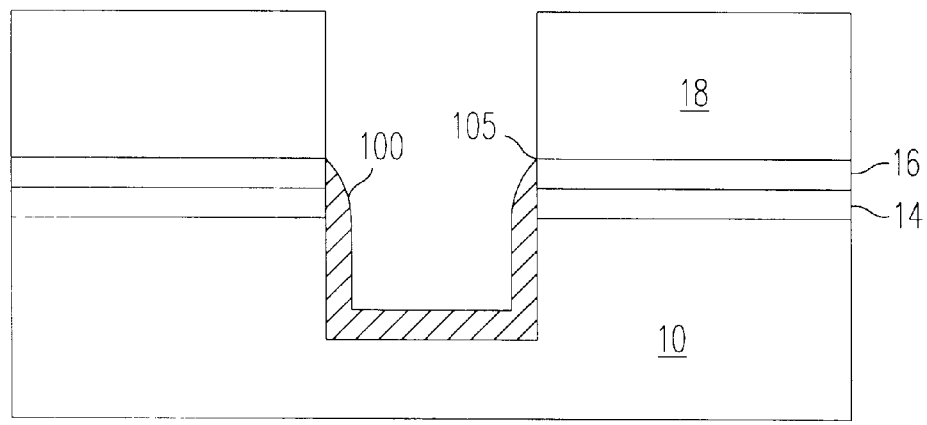
Figure 11:
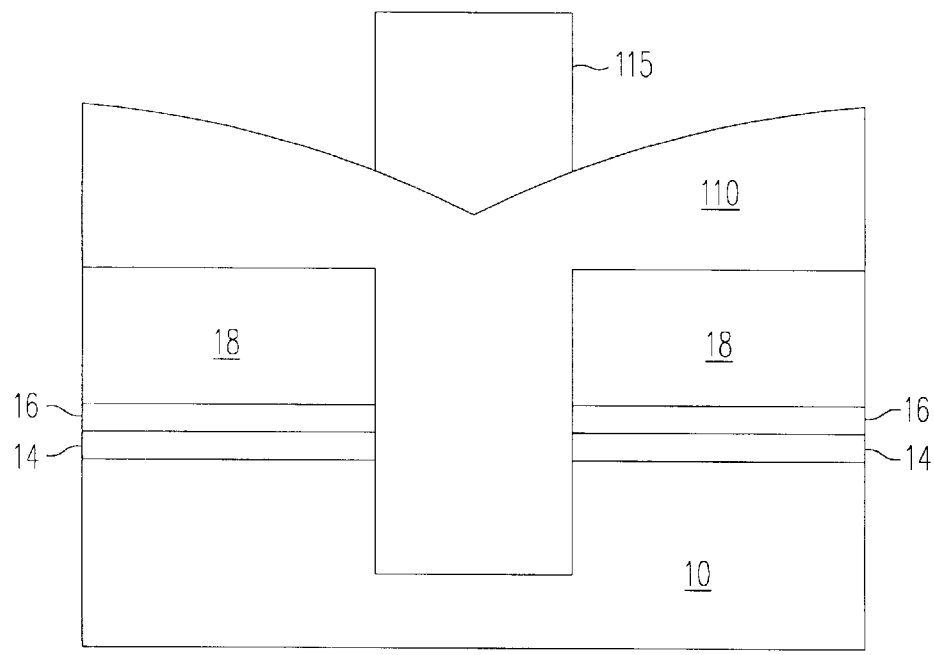

A thin thermal oxide layer 100 with a thickness in the range of 20 to 100 nm, and preferably with a thickness of approximately 50 nm is then grown in the etched opening, as shown in FIG. 10. The thermal oxide is introduced to reduce the mechanical stress from the sharp corner 105 created during the etch process. However, in the conventional process, without a SiON layer, there still is a problem of edge/corner stress at corner 105 where thermal oxide 100 meets the $Si_3N_4$ layer 18 which can undesirably result in gate oxide thinning in the final structure. Because SiON intrinsically has less stress than $Si_3N_4$, introduction of the SiON layer 16 has the additional benefit of reducing edge/corner stress, which in turn improves gate oxide integrity and reliability.

An oxide layer 110 is deposited over the thermal oxide 100 by any suitable oxide deposition process. For example, a TEOS deposition, a LTO (low temperature oxide) deposition, or an HTO (high temperature oxide) deposition process may be used. Oxide layer 110, illustrated in FIG. 11 has a thickness in the range of 600 to 700 nm and preferably has a thickness of approximately 620 nm. Patterned photoresist planarization mask 115 is formed over the dip in oxide layer 110, also shown in FIG. 11. As illustrated by the modeling results described above, use of SiON ARC layer also advantageously increases the tolerance on the process conditions for the photolithographic patterning of photoresist layer 115.

Figure 12:
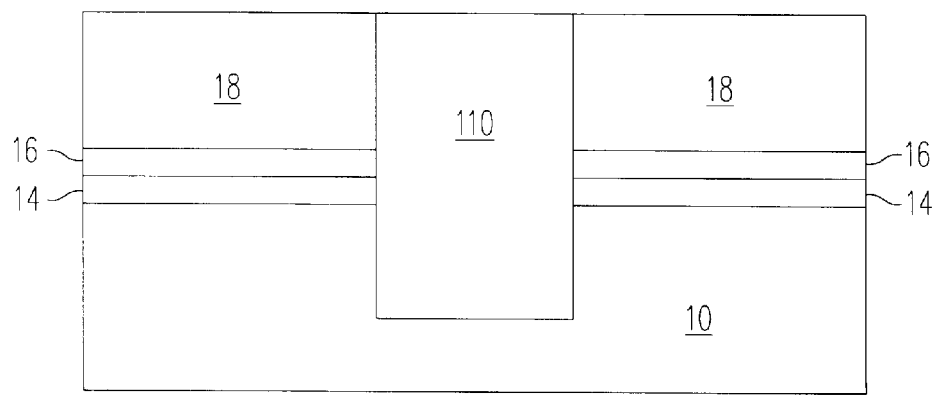

Conventional etching of the portions of oxide layer 110 not covered by photoresist layer 115 is then performed, followed by stripping of the photoresist 115 and chemical mechanical polishing of the oxide in the trench giving the structure illustrated in FIG. 12. A conventional acid chemistry strip is then used to remove the $Si_3N_4$ layer 18 and SiON layer 16. Because SiON responds to the same chemistry as $Si_3N_4$, use of SiON as an ARC layer does not introduce any additional process complexity.

Thus, introduction of an anti-reflective coating layer below a silicon nitride layer in the process of manufacturing isolation structure advantageously minimizes critical dimension variation. This effect increases process latitude in both the first photolithographic step and the second photolithographic patterning of the planarization mask. Use of silicon oxynitride as the ARC additionally reduces trench edge/corner stress, which improves gate oxide integrity and reliability. Finally, because SiON and $Si_3N_4$ respond to the same process chemistry, these benefits are achieved without increasing process complexity.

Although the invention has been described with reference to particular embodiments, the description is only an example of the invention's application and should not be taken as a limitation. In particular, while the benefits of SiON as an anti-reflective coating have been listed, other materials with similar refractive and chemical properties can also be employed. Various adaptations and combinations of features of the embodiments disclosed are within the scope of the invention as defined by the following claims.

What is claimed is:

1. A method comprising:
   depositing a first layer of silicon dioxide on a semiconductor substrate;
   depositing a layer of an inorganic anti-reflective coating material on said first silicon dioxide layer;
   depositing a layer of silicon nitride on said inorganic anti-reflective coating layer;
   depositing a first layer of photoresist material on said silicon nitride layer; and
   patterning said first photoresist layer, such that a patterned intermediate stack with at least one opening in said photoresist layer is produced.

2. The method of claim 1 wherein said inorganic anti-reflective coating material is silicon oxynitride.

3. The method of claim 2 wherein depositing a layer of an inorganic anti-reflective coating material is depositing a layer of a thickness between approximately 20 and 40 nm.

4. The method of claim 3 wherein depositing a layer of an inorganic anti-reflective coating material is depositing a layer of a thickness between approximately 25 and 28 nm.

5. The method of claim 1 further comprising:
   etching the patterned intermediate stack through the at least one opening in said first photoresist layer such that part of the semiconductor substrate is removed; and
   removing said first photoresist layer to produce a second intermediate stack.

6. The method of claim 5 wherein etching the patterned intermediate stack is etching using the same etchant to remove the silicon nitride layer and the inorganic anti-reflective layer.

7. The method of claim 5, further comprising growing a layer of thermal oxide in the at least one etched opening in said second intermediate stack.

8. The method of claim 7 wherein edge/corner stress where said thermal oxide layer meets said silicon nitride layer is minimized.

9. The method of claim 7 further comprising:

depositing a second layer of silicon dioxide over said thermal oxide layer;

depositing a second layer of photoresist over said second silicon dioxide layer; and patterning said second photoresist layer.

10. A method of limiting substrate reflectivity in photolithography of first and second layer masks in manufacturing semiconductor devices, the method comprising forming a stack comprising a layer of silicon oxynitride under a layer of silicon nitride, wherein the silicon oxynitride layer has a thickness between approximately 25 and 28 nm.

11. A structure comprising:

a silicon substrate;

a layer of silicon dioxide overlying said silicon substrate;

a layer of an inorganic anti-reflective coating overlying said silicon dioxide;

a layer of silicon nitride overlying said inorganic anti-reflective coating; and a layer of photoresist in which a pattern is formed by a lithographic process.

12. The structure of claim 11 wherein the inorganic anti-reflective coating is silicon oxynitride.

13. The structure of claim 12 wherein the inorganic anti-reflective coating has a thickness between approximately 20 and 40 nm.

14. The structure of claim 13 wherein the inorganic anti-reflective coating has a thickness between approximately 25 and 28 nm.

* * * * *